(12) United States Patent
Huang et al.

(10) Patent No.: US 10,978,144 B2
(45) Date of Patent: Apr. 13, 2021

(54) INTEGRATED CIRCUIT AND OPERATING METHOD THEREOF

(71) Applicant: Taiwan Semiconductor Manufacturing Co., Ltd., Hsinchu (TW)

(72) Inventors: Chia-En Huang, Hsinchu County (TW); Hidehiro Fujiwara, Hsin-Chu (TW); Jui-Che Tsai, Tainan (TW); Yen-Huei Chen, Hsinchu County (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 27 days.

(21) Appl. No.: 16/572,625

(22) Filed: Sep. 17, 2019

(65) Prior Publication Data
US 2021/0082495 A1  Mar. 18, 2021

(51) Int. Cl.
| G11C 7/00 | (2006.01) |
| G11C 11/419 | (2006.01) |
| H01L 27/11 | (2006.01) |
| G11C 5/06 | (2006.01) |
| G11C 11/418 | (2006.01) |

(52) U.S. Cl.
CPC .......... *G11C 11/419* (2013.01); *G11C 5/063* (2013.01); *G11C 11/418* (2013.01); *H01L 27/1104* (2013.01)

(58) Field of Classification Search
CPC ..... G11C 11/419; G11C 5/063; G11C 11/418; H01L 27/1104
USPC ................................... 365/189.16
See application file for complete search history.

(56) References Cited

U.S. PATENT DOCUMENTS

| 9,324,392 B1* | 4/2016 | Asenov ............... G11C 11/418 |
| 2006/0262628 A1* | 11/2006 | Nii ...................... G11C 11/412 365/226 |
| 2020/0125693 A1* | 4/2020 | Frederick, Jr. ........ G06F 30/394 |

\* cited by examiner

*Primary Examiner* — Vu A Le
(74) *Attorney, Agent, or Firm* — JCIPRNET (57) ABSTRACT

An integrated circuit and an operating method thereof are provided. The integrated circuit includes memory cells, at least one first word line, second word lines, bit lines and write-assist bit lines. The at least one first word line is electrically connected to at least one row of the memory cells. The second word lines are electrically connected to other rows of the memory cells. Two bit lines are located between a column of the memory cells and two write-assist bit lines. The bit lines and the write-assist bit lines are configured to be electrically disconnected with each other when at least one of the memory cells electrically connected with the at least one first word line is configured to be written, and electrically connected with each other when at least one of the memory cells electrically connected to the second word lines is configured to be written.

20 Claims, 10 Drawing Sheets

INTEGRATED CIRCUIT AND OPERATING METHOD THEREOF

BACKGROUND

A memory integrated circuit includes an array of memory cells, which can be implemented as volatile memory cells or non-volatile memory cells. The volatile memory cells, such as random-access memory (RAM) cells, require power to maintain its stored information. On the other hand, non-volatile memory cells, such as read-only memory (ROM) cells, can maintain stored information even when not powered. The electronic data can be read from and/or written into the array of memory cells through various control lines. During writing operations, the voltage written into far-end memory cells is inevitably dropped from the voltage applied at a near side of the array of the memory cells. Therefore, writing ability for the far-end memory cells is generally lower than writing ability for the near-end memory cells, and an appropriate write assist scheme for the far-end memory cells is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

Figure 1A:
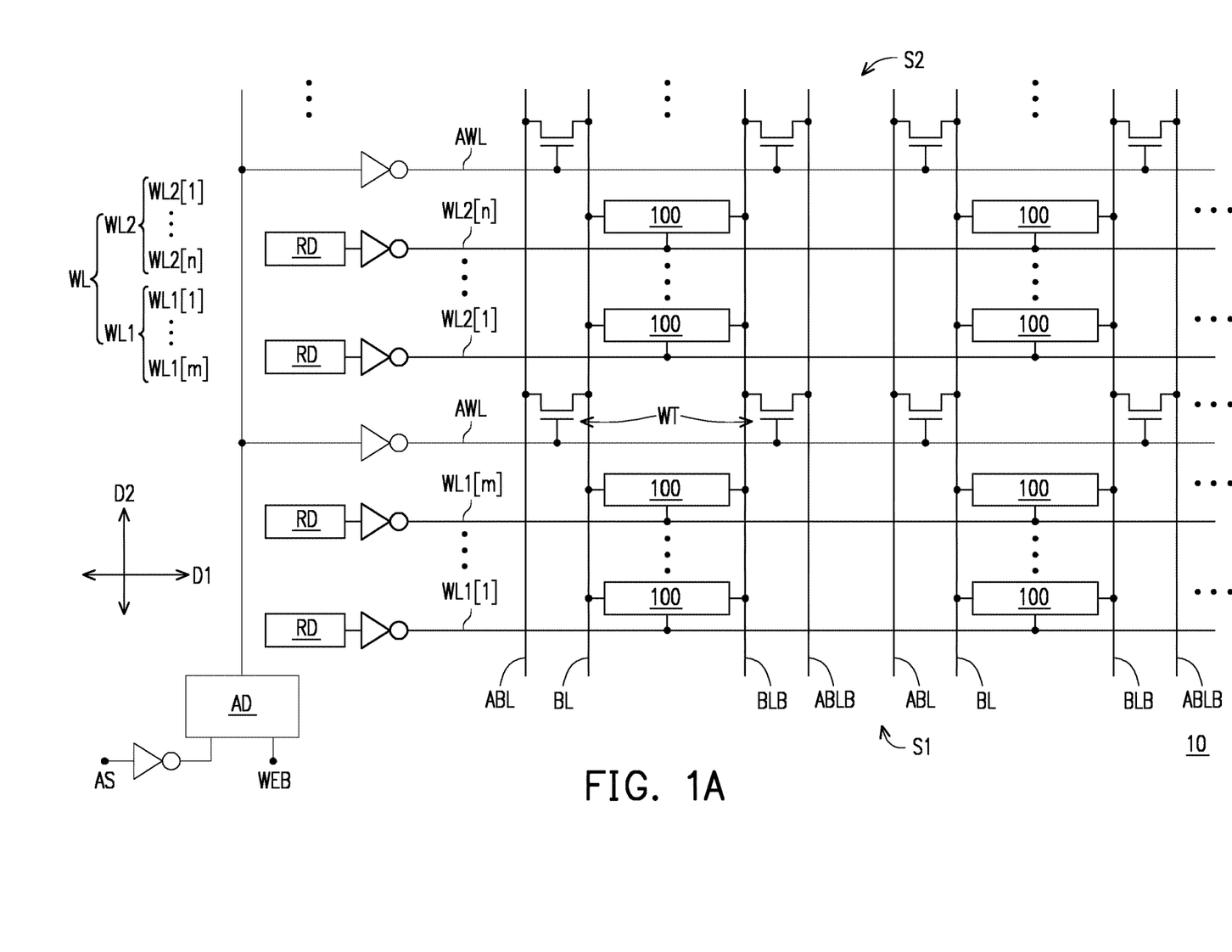
FIG. 1A is a circuit diagram illustrating an integrated circuit according to some embodiments of the present disclosure.
Figure 1B:
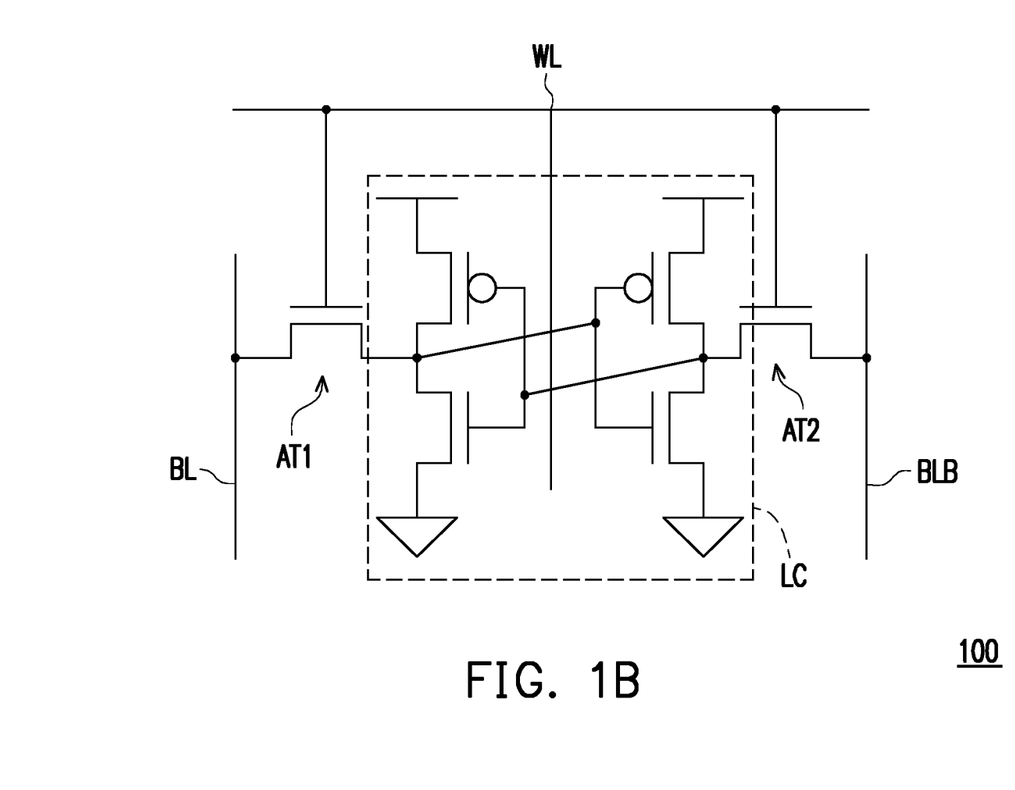
FIG. 1B is a circuit diagram illustrating a memory cell shown in FIG. 1A.

FIG. 1A is a circuit diagram illustrating an integrated circuit 10 according to some embodiments of the present disclosure. FIG. 1B is a circuit diagram illustrating a memory cell 100 shown in FIG. 1A.

Referring to FIG. 1A, the integrated circuit 10 is a memory integrated circuit, and includes an array of memory cells 100. The memory cells 100 are arranged along multiple columns and multiple rows. The columns of the memory cells 100 are arranged along a first direction D1, and extend along a second direction D2. The rows of the memory cells 100 are arranged along the second direction D2, and extend along the first direction D1. The first direction D1 is intersected with the second direction D2. For instance, the first direction D1 is substantially perpendicular to the second direction D2.

Referring to FIG. 1A and FIG. 1B, in some embodiments, the memory cells 100 are static random access memory (SRAM) cells. For instance, as shown in FIG. 1B, each of the memory cells 100 may be a single port SRAM cell, such as a single port 6T-SRAM cell. The single port 6T-SRAM cell includes a latch circuit LC for storing data, and may include two access transistors AT1 and AT2 functioned for controlling access to the single port 6T-SRAM cell. For instance, the latch circuit LC includes two cross-coupled CMOS inverters, each containing a NMOS transistor and a PMOS transistor. The access transistors AT1 and AT2 are, for example, NMOS transistors, and sources or drains of the access transistors AT1 and AT2 are electrically connected to a pair of complementary bit lines BL and BLB. In addition, gates of the access transistors AT1 and AT2 are electrically connected to a word line WL. In some embodiments, during a read operation, the access transistors AT1 and AT2 of the selected memory cell 100 are turned on, and the pair of complementary bit lines BL and BLB are pre-charged. One of these complementary bit lines BL and BLB is discharged through the latch circuit LC, and a differential voltage set up across these bit lines BL and BLB is sensed, such that the data stored in the selected memory cell 100 can be determined. In some embodiments, during a writing operation, the access transistors AT1 and AT2 of the selected memory cell 100 are turned on, and the pair of complementary bit lines BL and BLB are set to a desired logic state (e.g., setting the bit line BL to a logic low voltage, and setting the bit line BLB to a logic high voltage). As such, the latch circuit LC changes its state (e.g., from a logic high state to a logic low state).

Referring back to FIG. 1A, in those embodiments where the memory cells 100 are single port SRAM cells, each column of the memory cells 100 share one pair of the complementary bit lines BL and BLB. The bit lines BL and BLB may extend along the second direction D2. In some embodiments, each column of the memory cells 100 are located between a pair of the complementary bit lines BL and BLB. The array of memory cells 100 has a first side S1, and has a second side S2 opposite to the first side S1. Bit line drivers (not shown) may be disposed at the first side S1 of the array of memory cells 100, and the first side S1 may also be referred as a near side. In this way, the second side S2 opposite to the first side S1 may also be referred as a far side. In order to improve writing ability for some of the memory cells 100 close to the far side (i.e., the second side S2), each pair of the complementary bit lines BL and BLB are connected to a pair of complementary write-assist bit lines ABL and ABLB. The write-assist bit lines ABL and ABLB may extend along the second direction D2. In some embodiments, the write-assist bit lines ABL and ABLB as well as the bit lines BL and BLB are at the same height, and are formed during a single patterning step. In alternative embodiments, the write-assist bit lines ABL and ABLB are at a level higher or lower than a level of the bit lines BL and BLB, and the write-assist bit lines ABL and ABLB and the bit lines BL and BLB are formed in different patterning steps. Each of the bit lines BL is located between a column of the memory cells 100 and one of the write-assist bit lines ABL, and each of the bit lines BLB is located between a column of the memory cells 100 and one of the write-assist bit lines ABLB. During a writing operation, the write-assist bit lines ABL may be provided with a voltage substantially identical with a voltage applied to the bit lines BL, and are functioned for assisting the bit lines BL to invert the states of the memory cells 100. In some embodiments, the write-assist bit lines ABL are functioned to charge or discharge the bit lines BL, such that the voltage of each bit line BL from the near side (i.e., the first side S1) to the far-side (i.e., the second side S2) of the array of the memory cells 100 can be kept substantially constant. Similarly, the write-assist bit lines ABLB may be provided with a voltage substantially identical with a voltage applied to the bit lines BLB, and are functioned to charge or discharge the bit lines BLB. As a result, writing ability for those memory cells 100 close to the far side (i.e., the second side S2) of the array of the memory cells 100 can be improved.

The integrated circuit 10 includes a plurality of the word lines WL. The word lines WL may extend along the first direction D1, and may be respectively connected to a row of the memory cells 100. In some embodiments, each word line WL may be electrically connected to a row decoder RD, and an inverter may be electrically connected between each word line WL and the corresponding row decoder RD. In alternative embodiments, the row decoders RD connected to the word lines WL are integrated into a large row decoder (not shown). The present disclosure is not limited to the configuration of the row decoder. The word lines WL include at least one first word line WL1 close to the near side (i.e., the first side S1) of the array of the memory cells 100, and include a plurality of second word lines WL2 close to the far side (i.e., the second side S2) of the array of the memory cells 100. The memory cells 100 connected to the at least one first word line WL1 may be referred as near-end memory cells, and charging/discharging the bit lines BL and BLB by using the write-assist bit lines ABL and ABLB while writing one of these near-end memory cells 100 may not be necessary. Accordingly, the write assist bit lines ABL and ABLB may be configured not to receive a write voltage nor electrically connect to the bit lines BL and BLB when at least one of the near-end memory cells 100 is subjected to a writing operation, which will be further elaborated in the following paragraphs. On the other hand, the rows of the memory cells 100 connected to the second word lines WL2 may be referred as far-end memory cells, and charging/discharging the bit lines BL and BLB by using the write-assist bit lines ABL and ABLB while writing at least one of these far-end memory cells 100 may be needed. As such, the write-assist bit lines ABL and ABLB may be configured to receive a write voltage and electrically connect to the bit lines BL and BLB when at least one of the far-end memory cells 100 is subjected to a writing operation, which will also be further elaborated in the following paragraphs. In some embodiments, the first word lines WL include first word lines WL1[1] through WL1[m], where "m" is an integer that is greater than 1. The first word lines WL[1] through WL[m] are arranged in numeral order from the near side (i.e., the first side S1) of the array of the memory cells 100 toward the second word lines WL2. On the other hand, the second word lines WL2 may include second word lines WL2[1] through WL2[n], where "n" is an integer that is greater than 1. The second word lines WL2[1] through WL2[n] are arranged in numeral order from the first word line WL1[m] to the far side (i.e., the second side S2) of the array of the memory cells 100. According to design requirements, those skilled in the art may adjust the number of "m" for determining a distribution range of the near-end memory cells. Similarly, those skilled in the art may adjust the number of "n" for determining a distribution range of the far-end memory cells. The present disclosure is not limited to the values of "m" and "n". In alternative embodiments, the word lines WL only include a single first word line WL1.

In some embodiments, the integrated circuit 10 further includes a plurality of write-assist transistors WT. As shown in FIG. 1A, the write-assist transistors WT may be implemented by NMOS transistors. Alternatively, the write-assist transistors WT may be implemented by PMOS transistors. Some of the write-assist transistors WT are respectively connected between one of the bit lines BL and an adjacent write-assist bit line ABL, and others of the write-assist transistors WT are respectively connected between one of the bit lines BLB and an adjacent write-assist bit line ABLB. One of the source and drain of each write-assist transistor WT is connected to one of the bit lines BL or one of the bit lines BLB, whereas the other one of the source and drain of each write-assist transistor WT is connected to an adjacent write-assist bit line ABL or ABLB. In addition, in some embodiments, the integrated circuit 10 further includes a plurality of write-assist word lines AWL. The write-assist word lines AWL may extend along the first direction D1, and the gate of each write-assist transistor WT is connected to one of the write-assist word lines AWL. The write-assist word lines AWL are functioned for switching the write-assist transistors WT. When the write-assist transistors WT are turned on, the bit lines BL and BLB and adjacent write-assist bit lines ABL and ABLB are electrically connected through the write-assist transistors WT, and the bit lines BL and BLB can be charged or discharged by the write-assist bit lines ABL and ABLB. On the other hand, when the write-assist transistors WT are turned off, the bit lines BL and BLB are electrically disconnected from the write-assist bit lines ABL and ABLB, and the bit lines BL and BLB are not charged or discharged by the write-assist bit lines ABL and ABLB. In some embodiments, some columns of the write-assist transistors WT are respectively connected between one of the bit lines BL and an adjacent write-assist bit line ABL, whereas other columns of the write-assist transistors WT are respectively connected between one of the bit lines BLB and an adjacent write-assist bit line ABLB. In these embodiments, the write-assist transistors WT may be arranged as an array that has multiple columns and multiple rows. The write-assist word lines AWL may respectively connected to a row of the write-assist transistors WT. In addition, at least one of the second word lines WL2 may be located between adjacent write-assist word lines AWL. However, those skilled in the art may adjust the arrangement of the second word lines WL2 and the write-assist word lines AWL according to design requirements, the present disclosure is not limited thereto.

In some embodiments, the write-assist word lines AWL are connected to a write-assist driver AD. Inverters may respectively connected between the write-assist driver AD and each write-assist word line AWL. The write-assist driver AD is configured to enable the write-assist word lines AWL in certain conditions. In some embodiments, the write-assist driver AD determines when to enable the write-assist word lines AWL according to inputs including a write enablement signal WEB and a write-assist enable signal AS. In some embodiments, the write enablement signal WEB is at a logic low level when at least one of the memory cells 100 is subjected to a writing operation, whereas the write enablement signal WEB is at a logic high level when the memory cells 100 are not subjected to writing operations. In addition, in some embodiments, the write-assist enable signal AS is at a logic low level when one of the near-end memory cells 100 is selected for an operation (e.g., a reading operation, a writing operation or the like), whereas the write-assist enable signal AS is at a logic high level when one of the far-end memory cells 100 is selected for an operation (e.g., a reading operation, a writing operation or the like). In these embodiments, the write-assist enable signal AS is at the logic low level when at least one of the memory cells 100 connected to the first word lines WL1 is selected, whereas the write-assist enable signal AS is at the logic high level when at least one of the memory cells 100 connected to the second word lines WL2 is selected. The write-assist driver AD enables the write-assist word lines AWL when the write enablement signal WEB is at the logic low level, and the write-assist enable signal AS is at the logic high level. In addition, the write-assist driver AD is configured not to enable the write-assist word lines AWL in the following two conditions. First, the write enablement signal WEB is at the logic high level when the write-assist enable signal AS is at the logic high level or the logic low level. Second, the write enablement signal WEB is at the logic low level, and the write-assist enable signal AS is at the logic low level. In some embodiments, the write-assist enable signal AS is input to the write-assist driver AD through an inverter, and the write-assist driver AD may be implemented by a logic circuit, such as an AND gate.

Figure 2A:
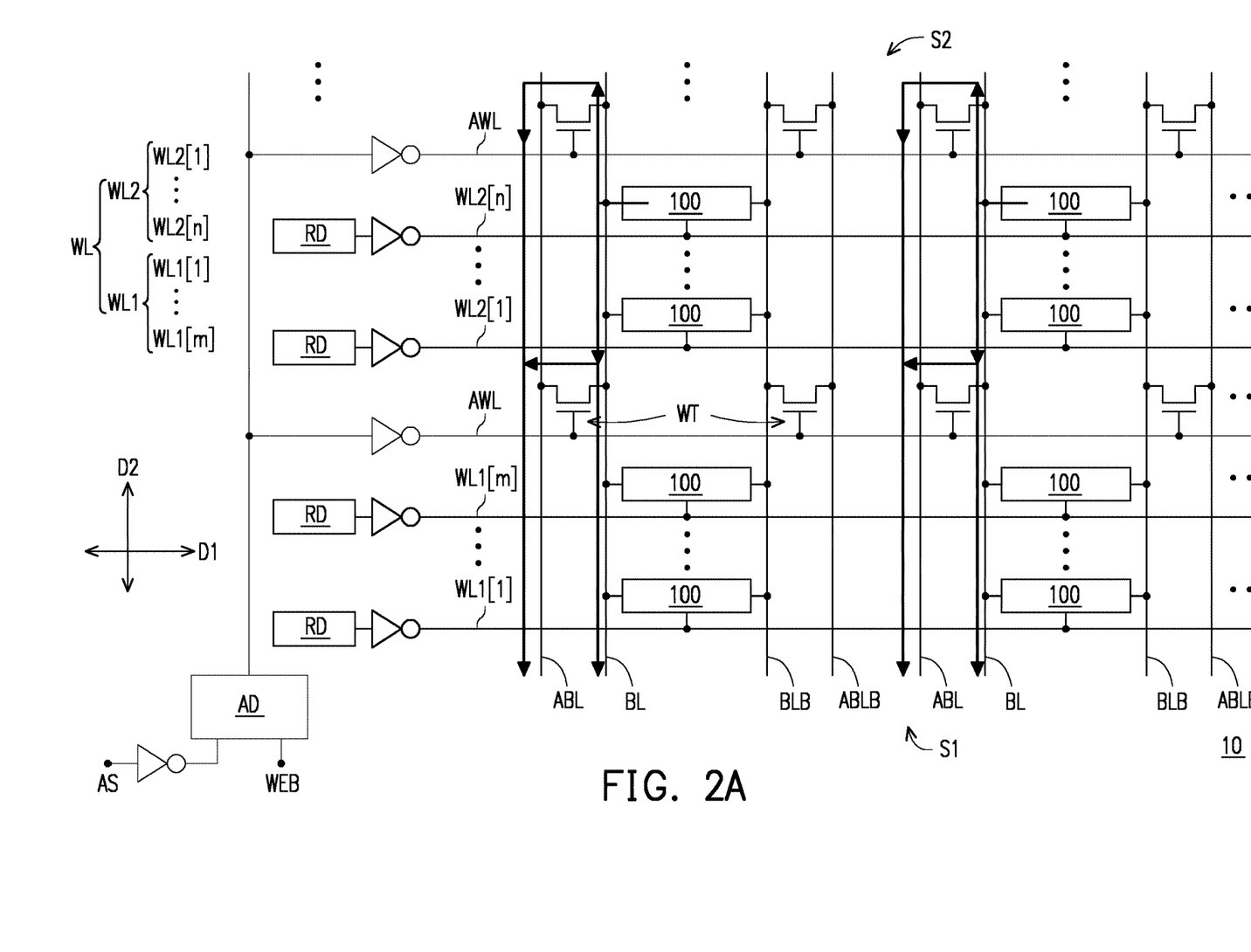
FIG. 2A exemplarily illustrates writing operations for far-end memory cells in the integrated circuit as shown in FIG. 1A.

FIG. 2A exemplarily illustrates writing operations for far-end memory cells 100 in the integrated circuit 10 as shown in FIG. 1A.

Referring to FIG. 2A, when at least one of the far-end memory cells 100 (e.g., two of the far-end memory cells 100) are subjected to writing operations, the writing enablement signal WEB is at the logic low level, whereas the write-assist enable signal AS is at the logic high level. As such, the write-assist driver AD is configured to enable the write-assist word lines AWL, thus the write-assist transistors WT are turned on by the enabled write-assist word lines AWL. Once the write-assist transistors WT are turned on, each of the write-assist bit lines ABL is electrically connected to an adjacent bit line BL, and each of the write-assist bit lines ABLB is electrically connected to an adjacent bit line BLB. Therefore, the write-assist bit lines ABL, which are provided with a voltage substantially identical with a write voltage applied to the bit lines BL, charge or discharge the bit lines BL through the write-assist transistors WT electrically connected in between. Similarly, write-assist bit lines ABLB, which are provided with a voltage substantially identical with a write voltage applied to the bit lines BLB, charge or discharge the bit lines BLB through the write-assist transistors WT electrically connected in between. As a result, the voltage variation of the bit lines BL from the near side (i.e., the first side S1) to the far side (i.e., the second side S2) of the array of the memory cells 100 can be significantly reduced, and the voltages applied to the far-end memory cells 100 through the bit lines BL may be substantially equal or very close to the voltages supplied to the write-assist bit lines ABL (i.e., the write voltage applied to the bit lines BL). Similarly, the voltage variation of the bit lines BLB from the near side (i.e., the first side S1) to the far side (i.e., the second side S2) of the array of the memory cells 100 can be significantly reduced, and the voltages applied to the far-end memory cells 100 through the bit lines BLB may be substantially equal or very close to the voltages supplied to the write-assist bit lines ABLB. Thereby, writing ability for the far-end memory cells 100 can be improved. In addition, data may be written into the far-end memory cells 100 through different current paths. In some embodiments where a logic low data is going to be written into the far-end memory cells 100, some current flow from the far-end memory cells 100 to the near side (i.e., the first side S1) of the array of the memory cells 100 along different paths (shown as the thick arrows in FIG. 2A). First, some current from the far-end memory cells 100 may flow along the bit lines BL electrically connected to these far-end memory cells 100 without turning to the adjacent write-assist bit lines ABL through the write-assist transistors WT electrically connected in between. Second, some current from the far-end memory cells 100 may flow along the bit lines BL electrically connected to these far-end memory cells 100, and then turn to the adjacent write-assist bit lines ABL through the write-assist transistors WT electrically connected in between before arriving the near side (i.e., the first side S1) of the array of the memory cells 100.

Figure 2B:
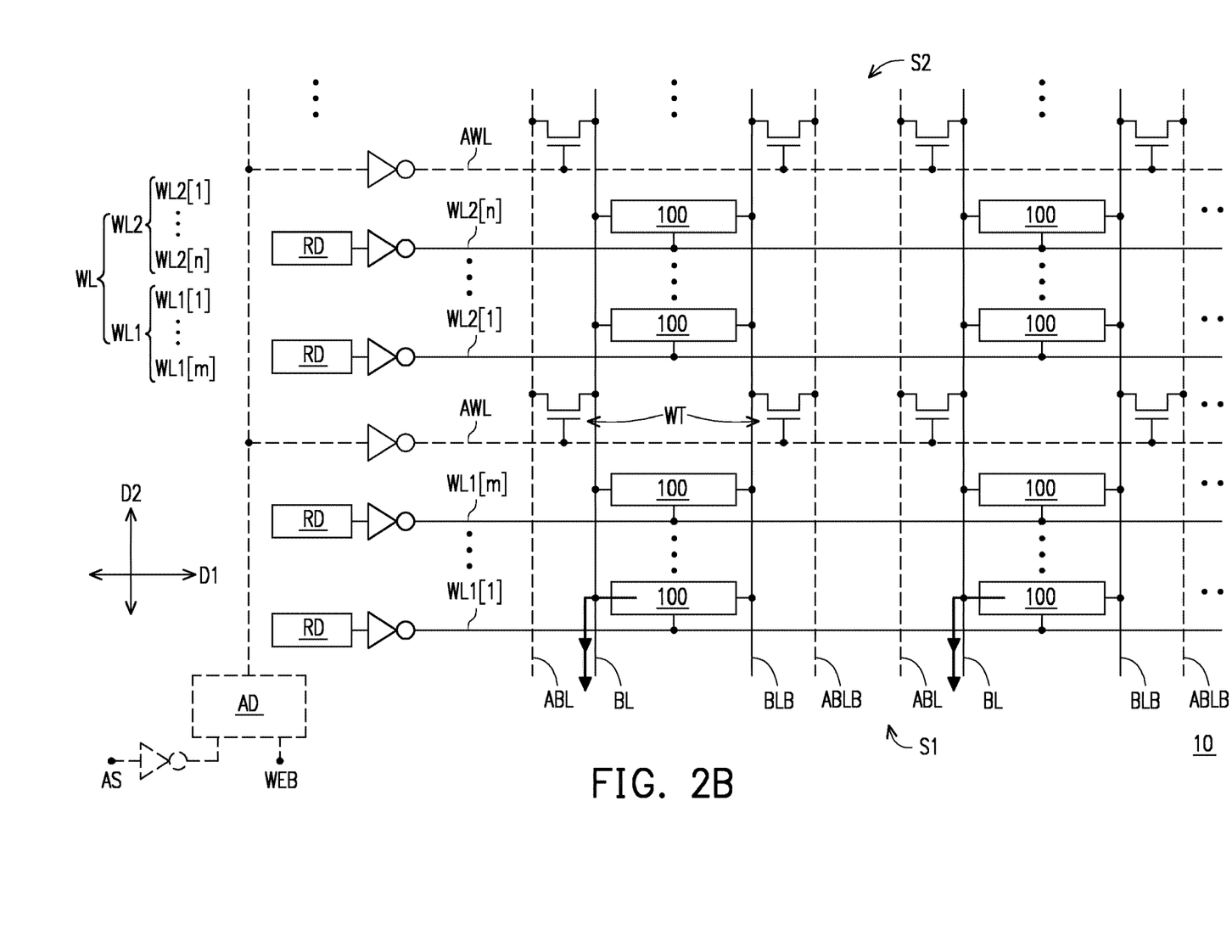
FIG. 2B exemplarily illustrates writing operations for near-end memory cells in the integrated circuit as shown in FIG. 1A.

FIG. 2B exemplarily illustrates writing operations for near-end memory cells 100 in the integrated circuit 10 as shown in FIG. 1A.

Referring to FIG. 2B, when at least one of the near-end memory cells 100 (e.g., two of the near-end memory cells 100) are subjected to writing operations, both of the writing enablement signal WEB and the write-assist enable signal AS are at the logic low level. Accordingly, the write-assist driver AD is configured not to enable the write-assist word lines AWL, such that the write-assist transistors WT are turned off. Thereby, the bit lines BL and BLB are electrically disconnected from the write-assist bit lines ABL and ABLB, and would not be charged or discharged by the write-assist bit lines ABL and ABLB. It should be noted that, the write-assist driver AD and the write-assist word lines AWL are illustrated by dash lines, in order to indicate that the write-assist word lines AWL are not enabled by the write-assist driver AD. In addition, the write-assist bit lines ABL and ABL may not be provided with a voltage, and are also illustrated by dash lines in FIG. 2B. In some embodiments where a logic low data is going to be written into the near-end memory cells 100, current from the near-end memory cells 100 flows to the near side (i.e., the first side S1) of the array of the memory cells 100 along the bit lines BL (shown as the thick arrows in FIG. 2B), and would not turn to the write-assist bit lines ABL through the write-assist transistors WT connected in between. Since the current path for writing the near-end memory cells 100 is relatively short (as compared to the current path for writing the far-end memory cells 100), voltage variation of the bit lines BL from the near side (i.e., the first side S1) of the array of the memory cells 100 to the near-end memory cells 100 is relatively insignificant. Therefore, charging or discharging the bit lines BL and BLB is unnecessary while writing the near-end memory cells 100. By not enabling the write-assist word lines AWL while writing the near-end memory cells 100, power consumption can be reduced.

Figure 3:
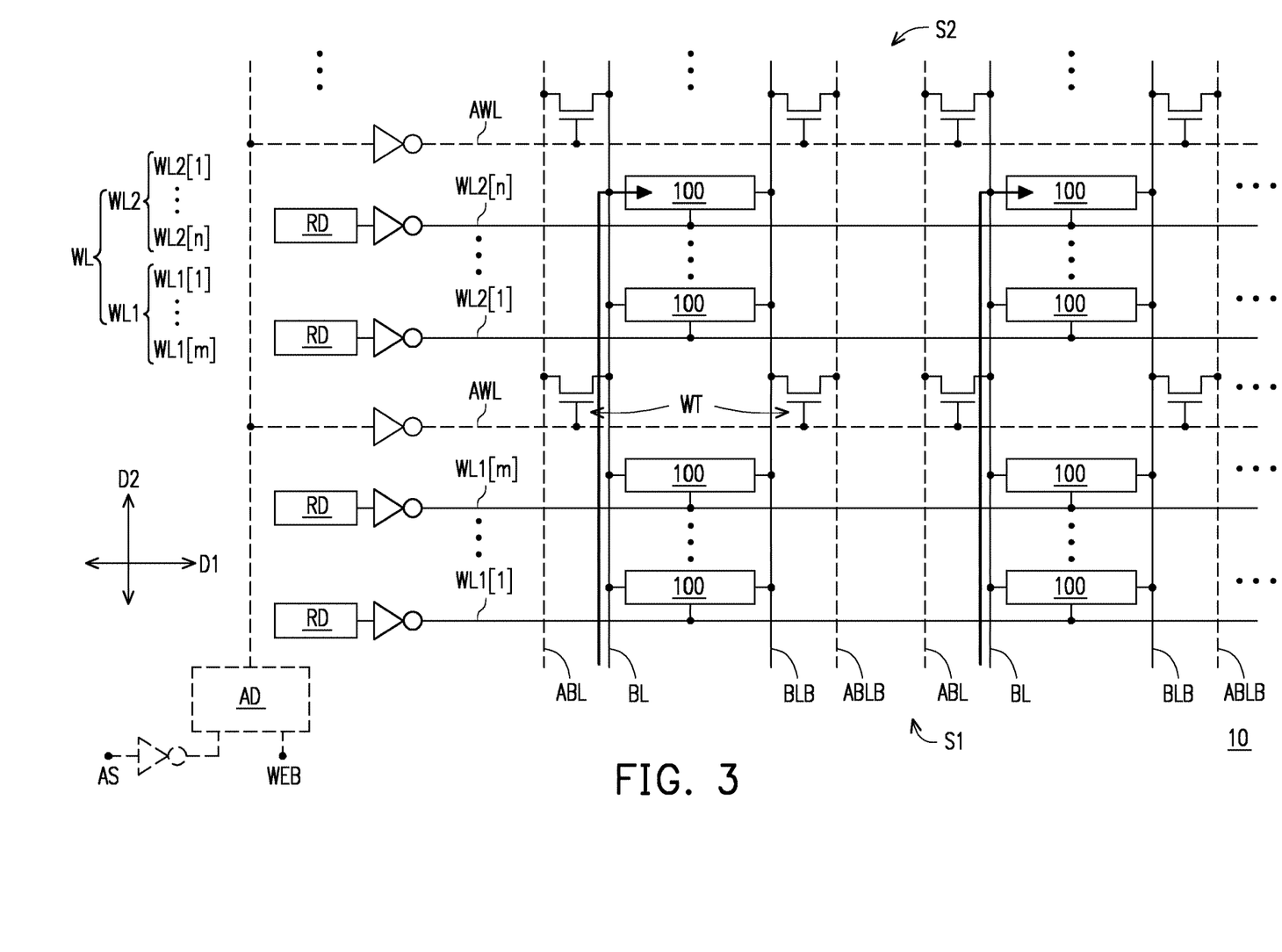
FIG. 3 exemplarily illustrates reading operations for the memory cells in the integrated circuit as shown in FIG. 1A.

FIG. 3 exemplarily illustrates reading operations for the memory cells 100 in the integrated circuit 10 as shown in FIG. 1A.

Referring to FIG. 3, when at least one of the memory cells 100 (e.g., two of the memory cells 100) are subjected to reading operations, the write-enablement signal WEB is at the logic high level, whereas the write-assist enable signal AS is dependent on an address of the selected memory cell(s) 100. Regardless of the state of the write-assist enable signal AS, the write-assist driver AD is configured not to enable the write-assist word lines AWL because of the logic high level of the write enablement signal WEB. As such, the write-assist transistors WT are turned off, and the bit lines BL and BLB are electrically disconnected from the write-assist bit lines ABL and ABLB. As a result, the bit lines BL and BLB would not be charged or discharged by the write-assist bit lines ABL and ABLB. It should be noted that, the write-assist driver AD and the write-assist word lines AWL are illustrated by dash lines, in order to indicate that the write-assist word lines AWL are not enabled by the write-assist driver AD. In addition, the write-assist bit lines ABL and ABL may not be provided with a voltage, and are also illustrated by dash lines in FIG. 2B. In some embodiments where a logic low data is read from the selected memory cells 100, current flow into the selected memory cells 100 from the near side (i.e., the first side S1) of the array of the memory cells 100 through the bit lines BL, and would not turn to the write-assist bit lines ABL through the write-assist transistors WT connected in between. Since a required read-out bias of the memory cells 100 may be lower than a required write-in bias of the memory cells 100, charging or discharging the bit lines BL and BLB while reading from the memory cells 100 is not necessary. By not enabling the write-assist word lines AWL while performing reading operations, power consumption can be reduced.

Figure 4:
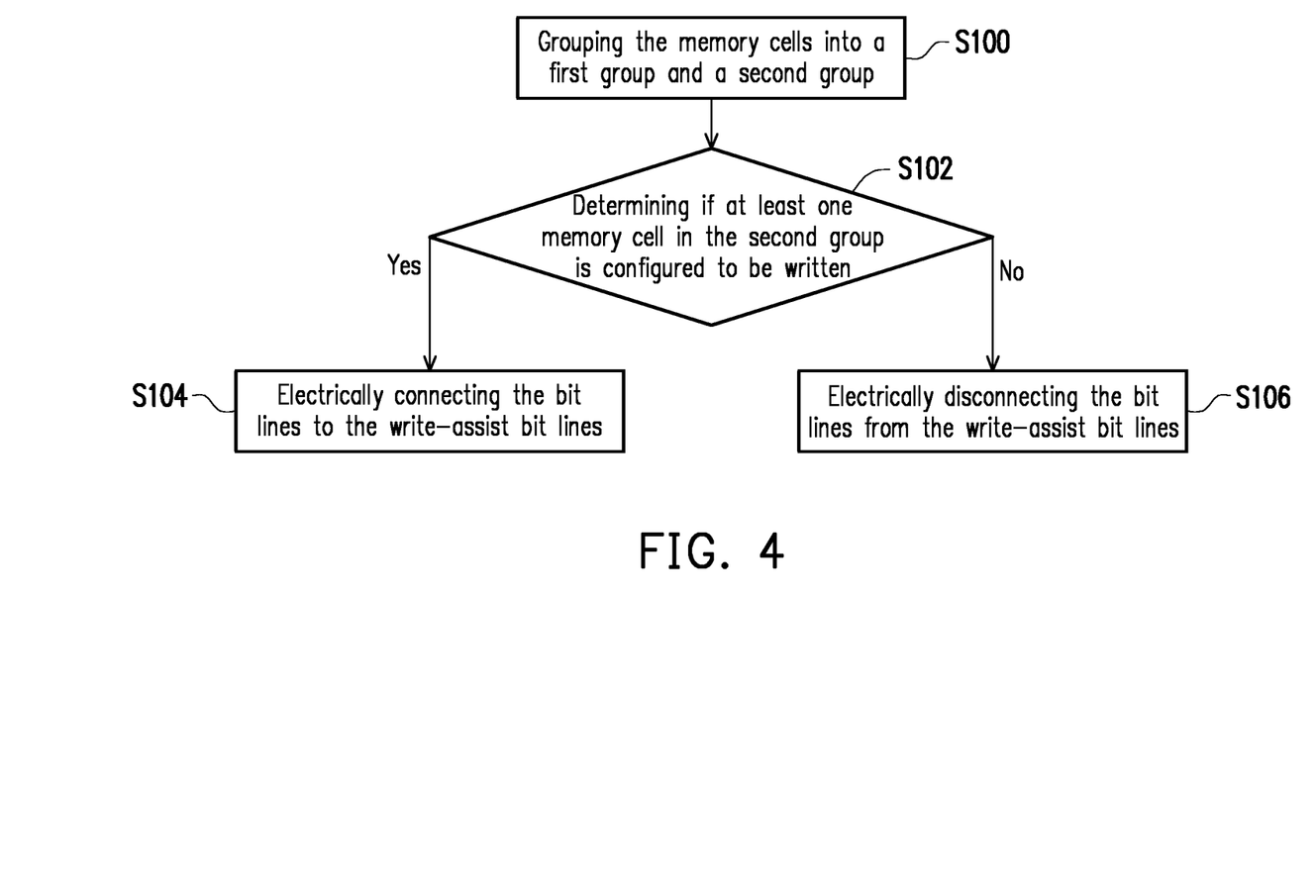
FIG. 4 is a process flow illustrating an operating method of an integrated circuit according to some embodiments of the present disclosure.

FIG. 4 is a process flow illustrating an operating method of the integrated circuit 10 according to some embodiments of the present disclosure.

Referring to FIG. 1A and FIG. 4, the operating method of the integrated circuit 10 including the following steps. At step S100, the array of the memory cells 100 are grouped into a first group and a second group. The first group of the memory cells 100 refer to the near-end memory cells 100, and are electrically connected to the first word lines WL1. On the other hand, the second group of the memory cells 100 refer to the far-end memory cells 100, and are electrically connected to the second word lines WL2. In some embodiments, the grouping operation is implemented by determining a critical row address. The word line(s) WL having row address lower than the critical row address are designated as the first word lines WL1, whereas the word lines WL having row address higher than the critical row address are designated as the second word lines WL2. In this way, the memory cells 100 electrically connected to the first word line(s) WL1 are determined to be the first group, whereas the memory cells 100 electrically connected to the second word lines WL2 are determined to the second group. That is, the critical row address can be considered as a boundary between the first word line(s) WL1 and the second word lines WL2, or as a boundary between the first and second groups of the memory cells 100.

Subsequently, step S102 is performed, to determine if at least one memory cell 100 in the second group is configured to be written. If at least one memory cell 100 in the second group is configured to be written, a write-assist scheme is going to be implemented. In some embodiments, the determining step is implemented by the write-assist driver AD. In these embodiments, the write-assist driver AD may be configured to make a decision according to inputs including the write enablement signal WEB and the write-assist enable signal AS. The write enablement signal WEB indicates whether if a writing operation is performed. The write-assist enable signal AS indicates whether if row address of the selected memory cell(s) 100 is higher than the critical row address described above. In other words, the write-assist enable signal AS indicates if the selected memory cell(s) 100 belong to the first group (i.e., near-end memory cells 100) or the second group (i.e., far-end memory cells 100). If the write enablement signal WEB indicates that a writing operation is performed, and the write-assist enable signal AS indicates that the selected memory cell(s) 100 belong to the second group (i.e., the far-end memory cells 100), then the write-assist driver AD determines that at least one memory cell 100 in the second group is configured to be written. Otherwise, the write-assist driver AD determines that none of the memory cells 100 in the second group is configured to be written.

If the result of step S102 shows that at least one memory cell 100 in the second group is configured to be written, then step S104 is performed, and the bit lines BL and BLB are electrically connected to the write-assist bit lines ABL and ABLB. In some embodiments, the write-assist driver AD is configured to enable the write-assist word lines AWL, and the enabled write-assist word lines AWL turn on the write-assist transistors WT, in order to electrically connecting the bit lines BL and BLB to the write-assist bit lines ABL and ABLB through the write-assist transistors WT electrically connected in between. On the other hand, if the result of step S102 indicates that none of the memory cells 100 in the second group is configured to be written, then step S106 is performed, and the bit lines BL and BLB are electrically disconnected from the write-assist bit lines ABL and ABLB. In some embodiments, the write-assist driver AD is configured not to enable the write-assist word lines AWL (or to disable the write-assist word lines AWL), and the write-assist transistors WT are turned off, thus the bit lines BL and BLB are electrically disconnected from the write-assist bit lines ABL and ABLB.

Therefore, in some embodiments, the write assist scheme of charging or discharging the bit lines BL and BLB by the write-assist bit lines ABL and ABLB is applied only when at least one memory cell 100 of the second group (i.e., the far-end memory cells 100) is configured to be written, thus power consumption can be reduced.

Figure 5A:
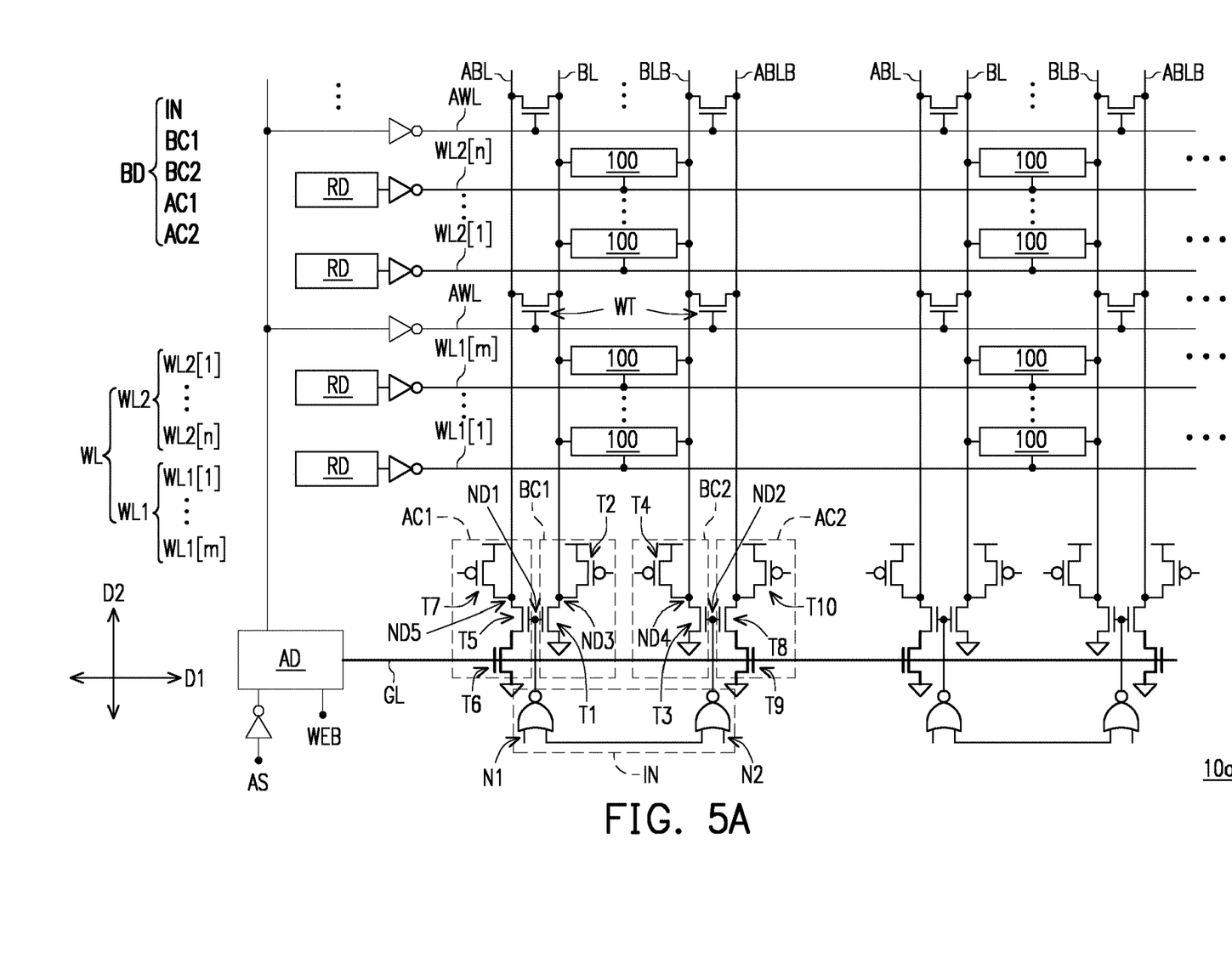
FIG. 5A, FIG. 5B and FIG. 6 are circuit diagrams illustrating integrated circuits according to some embodiments of the present disclosure.

FIG. 5A is a circuit diagram illustrating an integrated circuit 10*a* according to some embodiments of the present disclosure. The integrated circuit 10*a* shown in FIG. 5A is similar to the integrated circuit 10 shown in FIG. 1A. Only the differences therebetween will be described, the same or the like parts will not be repeated again.

Referring to FIG. 5A, the bit lines BL and BLB as well as the write assist bit lines ABL and ABLB connected to each column of the memory cells 100 are controlled by a bit line driver BD. In some embodiments, the bit line driver BD includes an input controller IN, two bit line controllers BC1 and BC2, and two write-assist bit line controllers AC1 and AC2. The input controller IN is configured to feed a logic high voltage and a logic low voltage to first and second nodes ND1 and ND2. The first node ND1 is electrically connected to the bit line controller BC1 and the write-assist bit line controller AC1, whereas the second node ND2 is electrically connected to the bit line controller BC2 and the write-assist bit line controller AC2. The bit line controller BC1 is configured to pull down or pull up the bit line BL according to the voltage at the node ND1, whereas the bit line controller BC2 is configured to pull down or pull up the bit line BLB according to the voltage at the node ND2. For instance, during a writing operation, one of the bit line BL and the bit line BLB is configured to be pulled up, whereas the other one of the bit line BL and the bit line BLB is configured to be pulled down. On the other hand, the write-assist bit line controller AC1 is configured to pull down, pull up or electrically float the write-assist bit line ABL according to the voltage at the node ND1, whereas the write-assist bit line controller AC2 is configured to pull down, pull up or electrically float the write-assist bit line ABLB according to the voltage at the node ND2. When the far-end memory cells 100 are configured to be written, the bit line BL and the write-assist bit line ABL are provided with substantially the same voltage, and the bit line BLB and the write-assist bit line ABLB are provided with another voltage. In other conditions including a writing operation for at least one near-end memory cell(s) 100 as well as a read operation, the write-assist bit lines ABL and ABLB are electrically floated. Since the write-assist bit lines ABL and ABLB receive voltages only in certain conditions, power consumption of the integrated circuit 10a can be further reduced.

In some embodiments, the input controller IN includes two NOR gates N1 and N2. An input of the NOR gate N1 is electrically connected to an input of the NOR gate N2. In addition, another input of the NOR gate N1 and another input of the NOR gate N2 are configured to receive a pair of a logic high voltage and a logic low voltage. On the other hand, outputs of the NOR gate N1 and the NOR gate N2 are electrically connected to the first and second node ND1 and ND2, respectively.

In some embodiments, the bit line controller BC1 includes transistors T1 and T2, whereas the bit line controller BC2 includes transistors T3 and T4. A conductive type of the transistors T1 and T3 may be complementary to a conductive type of the transistors T2 and T4. For instance, the transistors T1 and T3 are NMOS transistors, whereas the transistors T2 and T4 are PMOS transistors. A gate of the transistor T1 is electrically connected to the first node ND1. One of the source and drain of the transistor T1 is electrically connected to a third node ND3, whereas the other one of the source and drain of the transistor T1 is coupled to a logic low voltage. In addition, one of the source and drain of the transistor T2 is electrically connected to the third node ND3, whereas the other one of the source and drain of the transistor T3 is coupled to a logic high voltage. Similarly, a gate of the transistor T3 is electrically connected to the second node ND2. One of the source and drain of the transistor T3 is electrically connected to a fourth node ND4, whereas the other one of the source and drain of the transistor T3 is coupled to a logic low voltage. In addition, one of the source and drain of the transistor T4 is electrically connected to the fourth node ND4, whereas the other one of the source and drain of the transistor T4 is coupled to a logic high voltage. When the transistor T1 is turned on by the voltage at the first node ND1, the transistor T2 is configured to be turned off, and the bit line BL is coupled to the logic low voltage. On the other hand, when the transistor T1 is turned off, the transistor T2 is configured to be turned on, and the bit line BL is coupled to the logic high voltage. Similarly, when one of the transistors T2 and T3 is turned on, the other one of the transistors T2 and T3 is turned off. In this way, the bit line BL/BLB is either coupled to the logic low voltage or the logic high voltage.

In some embodiments, the write-assist bit line controller AC1 includes transistors T5, T6 and T7. A conductive type of the transistor T7 is complementary to a conductive type of the transistors T5 and T6. For instance, the transistor T7 is a PMOS transistor, whereas the transistors T5 and T6 are NMOS transistors. A gate of the transistor T5 is electrically connected to the first node ND1. One of the source and drain of the transistor T5 is electrically connected to the transistor T6, whereas the other one of the source and drain of the transistor T3 is electrically connected to a fifth node ND5. The fifth node N5 is electrically connected to the transistor T7 and the write-assist bit line ABL. A gate of the transistor T6 is electrically connected to the write-assist driver AD through a gate line GL. The gate line GL and the write-assist word lines AWL are both controlled by the write-assist driver AD. During writing a logic low data to at least one far-end memory cell(s) 100, the transistors T5 and T6 are turned on by the voltages at the first node ND1 and the gate line GL, respectively. When the transistors T5 and T6 are turned on, the voltage at the fifth node ND5 is pulled to a logic low voltage (e.g., a ground voltage or a negative voltage), which is coupled to a source or a drain of the transistor T6. Meanwhile, the transistor T7 is turned off. In this way, the write-assist bit line ABL is coupled to the logic low voltage through the transistors T5 and T6, and is configured to discharge the bit line BL through the write-assist transistors WT electrically connected in between. On the other hand, during writing a logic low data to at least one near-end memory cell(s) 100 or during a read operation, the transistors T5, T6 and T7 are turned off. In this way, the write-assist bit line ABL is electrically floated. Moreover, under a reset/standby mode, the transistors T5 and T6 are turned off, and the transistor T7 is turned on. As such, the fifth node ND5 is coupled to a logic high voltage, which is coupled to a source or a drain of the transistor T7. However, under the reset/standby mode, the write-assist transistors WT may not be turned on, and the bit lines BL are electrically disconnected from the write-assist bit lines ABL. Furthermore, the write-assist bit line controller AC2 includes transistors T8, T9 and T10. As shown in FIG. 5A, configuration of the transistors T8, T9 and T10 of the write-assist bit line controller AC2 is similar to the transistors T5, T6 and T7 of the write-assist bit line controller AC1. A procedure of writing a logic high data into one of the memory cells 100 is similar to the above-mentioned procedure of writing a logic low data into one of the memory cells 100, except that a logic low voltage (e.g., a ground voltage or a negative voltage) is input to the memory cell 100 through the corresponding bit line BLB rather than the bit line BL.

Figure 5B:
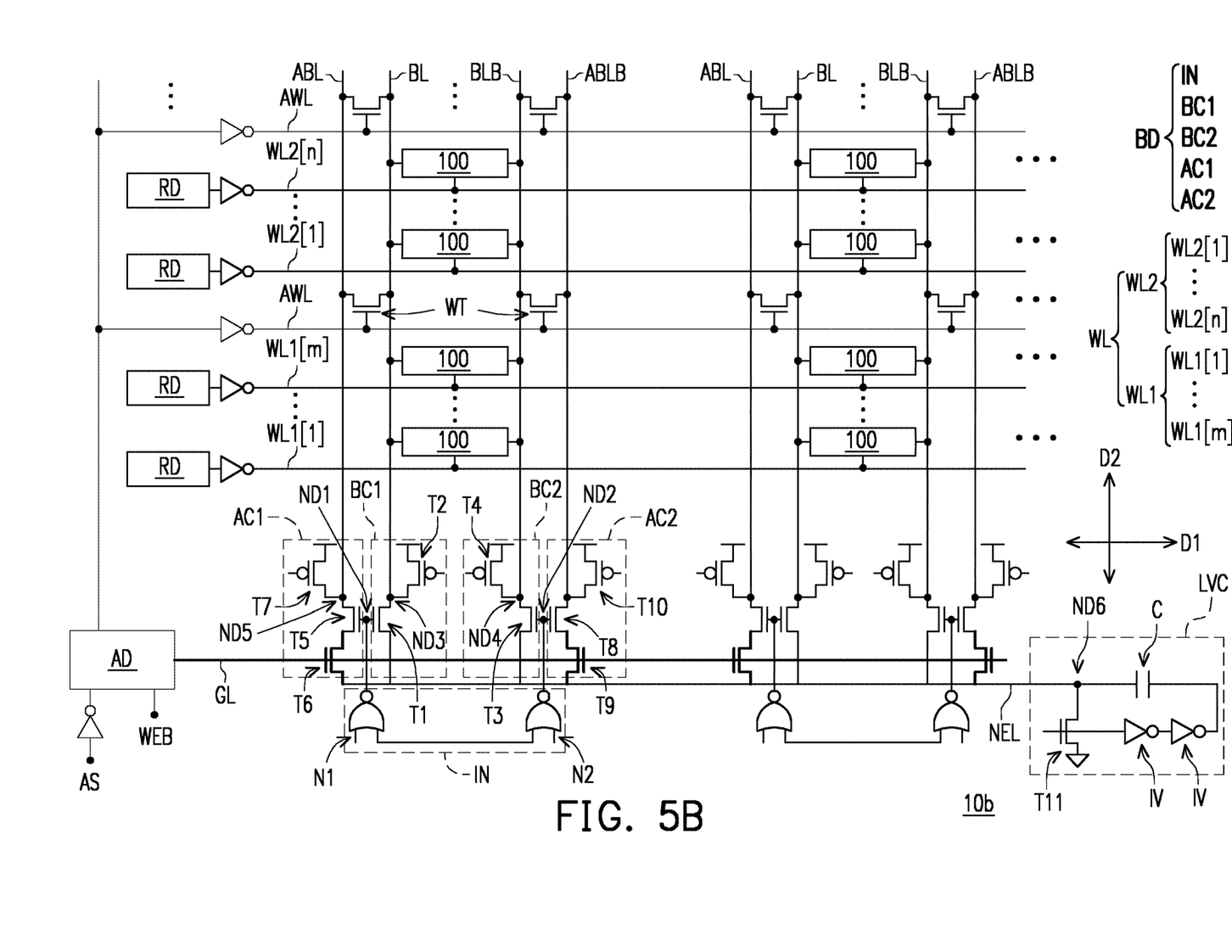

FIG. 5B is a circuit diagram illustrating an integrated circuit 10b according to some embodiments of the present disclosure. The integrated circuit 10a shown in FIG. 5B is similar to the integrated circuit 10a shown in FIG. 5A. Only the differences therebetween will be described, the same or the like parts will not be repeated again.

Referring to FIG. 5B, the integrated circuit 10b further includes a low voltage generation circuit LVC. The low voltage generation circuit LVC is electrically connected to the transistors T6 and T9 of the write-assist bit line controllers AC1 and AC2 as well as the transistors T1 and T3 of the bit line controllers BC1 and BC2, and configured to supply a ground voltage or a negative voltage to the write-assist bit lines ABL and ABLB as well as the bit lines BL and BLB. In some embodiments, the low voltage generation circuit LVC includes a transistor T11, two inverters IV and a capacitor C. The inverters IV are connected in series. The capacitor C is electrically connected between an output of the serially connected inverters IV and a sixth node ND6. A gate of the transistor T11 is electrically connected to a negative enablement line NEL, which is also electrically connected to an input of the serially connected inverters IV. One of the source and drain of the transistor T11 is coupled to a ground voltage, and the other one of the source and drain of the transistor T11 is electrically connected to the sixth node ND6. In addition, the transistors T6 and T9 of the write-assist bit line controllers AC1 and AC2 as well as the transistors T1 and T3 of the bit line controllers BC1 and BC2 are electrically connected to the sixth node ND6. In some embodiments, the transistor T11 is a NMOS transistor. In these embodiments, when the negative enablement line NEL is provided with a logic low voltage, the transistor T11 is turned off, and a voltage of the sixth node ND6 is coupled to a negative voltage. As such, the negative voltage can be supplied to the transistors T6 and T9 of the write-assist bit line controllers AC1 and AC2 as well as the transistors T1 and T3 of the bit line controllers BC1 and BC2. On the other hand, when the negative enablement line NEL is provided with a logic high voltage, the transistor T11 is turned on, and a voltage at the sixth node ND6 is pulled to the ground voltage. Accordingly, the transistors T6 and T9 of the write-assist bit line controllers AC1 and AC2 as well as the transistors T1 and T3 of the bit line controllers BC1 and BC2 are provided with the ground voltage.

Figure 6:
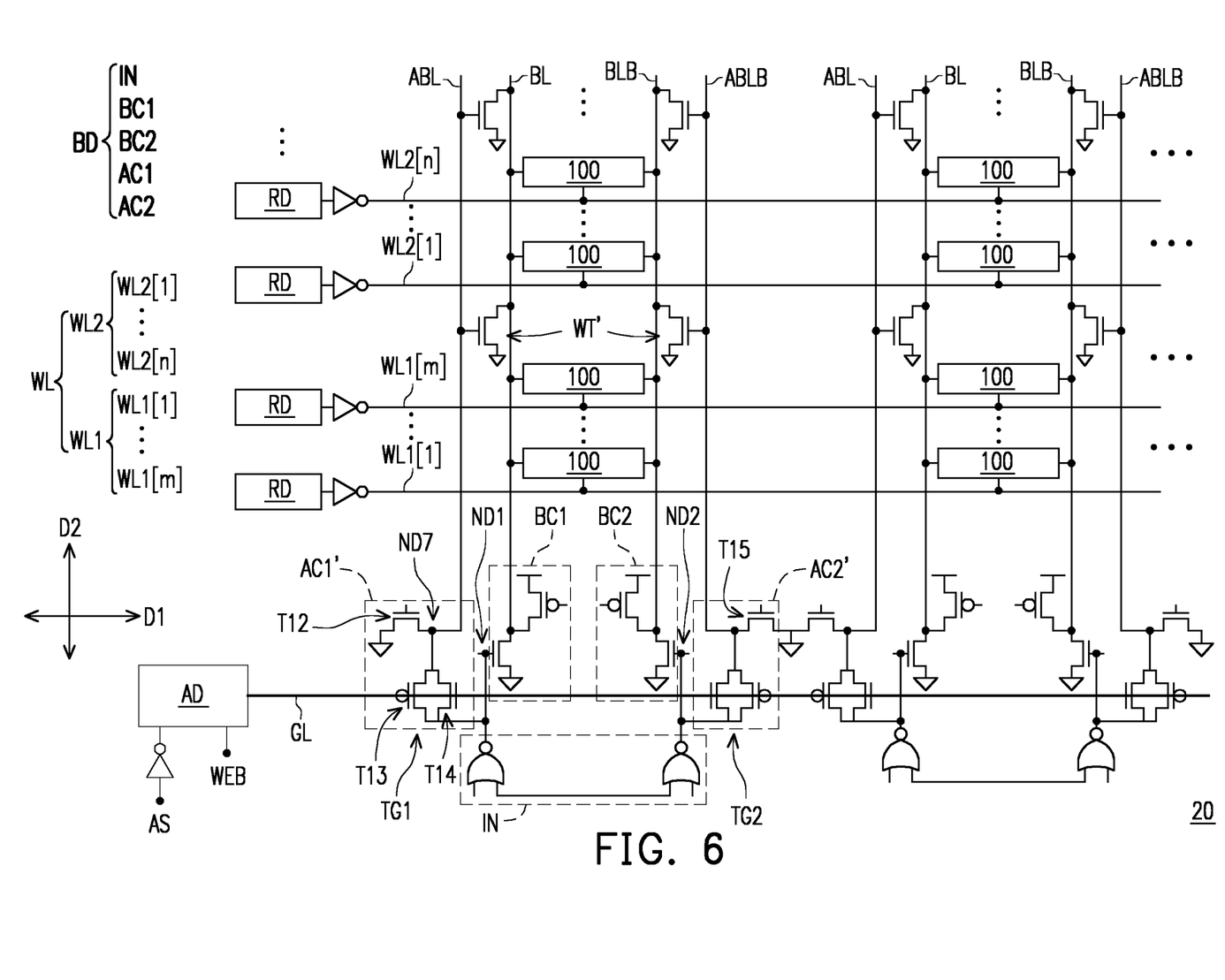

FIG. 6 is a circuit diagram illustrating an integrated circuit 20 according to some embodiments of the present disclosure. The integrated circuit 20 shown in FIG. 6 is similar to the integrated circuit 10a shown in FIG. 5A. Only the differences there between will be described, the same or the like parts will not be repeated again.

Referring to FIG. 5A and FIG. 6, the integrated circuit 20 shown in FIG. 6 does not include the write-assist word lines AWL shown in FIG. 5A. Gates of the write-assist transistors WT' are electrically connected to the write-assist bit lines ABL and ABLB. Sources or drains of the write-assist transistors WT' are electrically connected to the bit lines BL and BLB, whereas the other ones of the sources and drains of the write-assist transistors WT' are coupled to a logic low voltage (e.g., a ground voltage or a negative voltage). In this way, the write-assist transistors WT' are configured to be switch on or off by the write-assist bit lines ABL and ABLB. When the write-assist transistors WT' are turned on, the bit lines BL and BLB are helped to be pulled to the logic low voltage. On the other hand, when the write-assist transistors WT' are turned off, the bit lines BL and BLB are independently controlled by the bit line controllers BC1 and BC2.

In addition, in some embodiments, a write-assist bit line controller AC1' includes a transmission gate TG1 and a transistor T12. A seventh node ND7 electrically connected between the transmission gate TG1 and the transistor T12 is also electrically connected to the bit line BL. The transmission gate TG1 may include a pair of complementary transistors T13 and T14. Sources of the transistors T13 and T14 are electrically connected together, and drains of the transistors T13 and T14 are electrically connected together. The sources or drains of the transmission gate TG1 are electrically connected to the first node ND1, whereas the other ones of the sources and drains of the transmission gate TG1 are electrically connected to the seventh node ND7. A gate of the transistor T13 is electrically connected to the write-assist driver AD through the gate line GL, whereas a gate of the transistor T14 may be electrically connected to the gate line GL through an inverter (not shown). As such, the gates of the transistors T13 and T14 are provided with a pair of a logic high voltage and a logic low voltage. When at least one of the transistors T13 and T14 is turned on, the seventh node ND7 would be electrically connected to the first node ND1. Meanwhile, the transistor T12 is turned off, and the write-assist bit line ABL is controlled by the seventh node ND7 and the first node ND1. If the voltage at the seventh node ND7 and the first node ND1 is a logic high voltage, the write-assist bit line ABL electrically connected to the seventh node ND7 and the first node ND1 is configured to turn on the write-assist transistors WT', and the write-assist transistors WT' are configured to help with pulling the bit line BL to the logic low voltage or the logic high voltage. On the other hand, when both of the transistors T13 and T14 are turned off, the seventh node ND7 is electrically disconnected from the first node ND1. Meanwhile, the transistor T12 is turned on, and the seventh node ND7 is coupled to a logic low voltage (e.g., a ground voltage or a negative voltage) via the transistor T12. Accordingly, the write-assist bit line ABL electrically connected to the seventh node ND7 is configured not to turn on the write-assist transistors WT', and the bit line BL is independently controlled by the bit line controller BC1.

Similarly, in some embodiments, the write-assist bit line controller AC2' includes a transmission gate TG2 and a transistor T15. As shown in FIG. 6, a configuration of the transmission gate TG2 and the transistor T15 of the write-assist bit line controller AC2' is similar to the transmission gate TG1 and the transistor T12 of the write-assist bit line controller AC1', and would not be repeated again. In addition, in the embodiments shown in FIG. 6, the write-assist driver AD also enables the write-assist scheme according to inputs including the write enablement signal WEB and the write-assist enable signal AS as described with reference to FIG. 1A, except that the write-assist driver AD shown in FIG. 6 enables the write-assist scheme by a different approach. As described above, the write-assist driver AD shown in FIG. 6 enables the write-assist scheme by turning on the write-assist transistors WT' through the write-assist bit lines ABL and ABLB, rather than turning on the write transistors WT through the write-assist word lines AWL (as shown in FIG. 1A).

Figure 7:
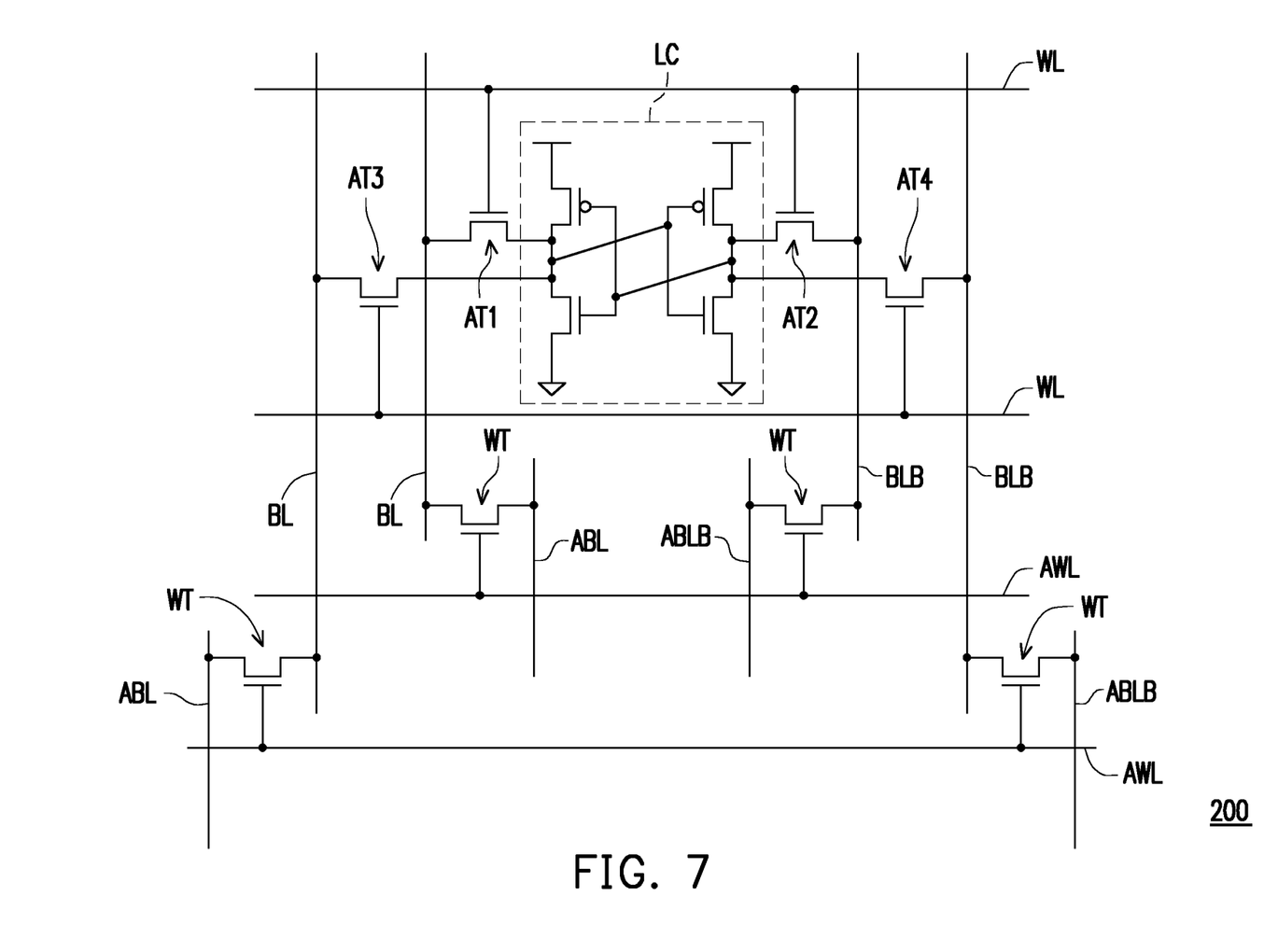
FIG. 7 is a circuit diagram illustrating a memory cell according to some embodiments of the present disclosure.

FIG. 7 is a circuit diagram illustrating a memory cell 200 according to some embodiments of the present disclosure. The memory cell 200 shown in FIG. 7 is similar to the memory cell 100 shown in FIG. 1B. Only the differences therebetween will be described, the same or the like parts will not be repeated again.

Referring to FIG. 1B and FIG. 7, in some embodiments, the memory cell 200 is a dual port SRAM cell, such as a dual port 8T SRAM cell. As compared to the memory cell 100 shown in FIG. 1B, the memory cell 200 shown in FIG. 7 are electrically connected to two word lines WL and two pairs of the bit lines BL and BLB. In some embodiments, the memory cell 200 further includes access transistors AT3 and AT4. The access transistors AT1 and AT2 are electrically connected to one of the word lines WL and a pair of the bit lines BL and BLB, whereas the access transistors AT3 and AT4 are electrically connected to another one of the word lines WL and another pair of the bit lines BL and BLB. In the embodiments illustrated in FIG. 7, each of the bit lines BL electrically connected to the memory cell 200 is connected to one of the write-assist bit lines ABL through one of the write-assist transistors WT (as described with reference to FIG. 1A), whereas each of the bit lines BLB electrically connected to the memory cell 200 is connected to one of the write-assist bit lines ABLB through one of the write-assist transistors WT. When the write-assist scheme is enabled, these write-assist transistors WT are turned on, and the write-assist bit lines ABL are configured to charge or discharge the bit lines BL and BLB.

However, in alternative embodiments, the memory cell may be a memory cell of another type, such as a dynamic random access memory (DRAM) cell, a megnetoresistive random access memory (MRAM) cell, a flash memory cell or the like. In these alternative embodiments, those skilled in the art may make certain modifications on the integrated circuit according to design requirements, so as to properly perform the write assist scheme as described above.

As above, a write-assist scheme is applied to charge or discharge the bit lines when at least one of the far-end memory cells is subjected to a writing operation. Therefore, voltage variation of the bit lines from a near side to a far side of the array of memory cells can be significantly reduced, and writing ability for the far-end memory cells can be improved. In addition, the write-assist scheme is only enabled when needed. Thus power consumption of the integrated circuit can be reduced.

According to some embodiments of the present disclosure, an integrated circuit comprises: a plurality of memory cells, arranged in an array having a plurality of rows and a plurality of columns; at least one first word line and a plurality of second word lines, extending along a first direction, wherein the at least one first word line is electrically connected to at least one row of the plurality of memory cells, and the plurality of second word lines are electrically connected to other rows of the plurality of memory cells; a plurality of bit lines, extending along a second direction, wherein each column of the plurality of memory cells are electrically connected between two of the plurality of bit lines; and a plurality of write-assist bit lines, extending along the second direction, wherein two of the plurality of bit lines are located between a column of the plurality of memory cells and two of the plurality of write-assist bit lines, wherein the plurality of bit lines and the plurality of write-assist bit lines are configured to be electrically disconnected with each other when at least one of the memory cells electrically connected with the at least one first word line is configured to be written, and wherein the plurality of bit lines are electrically connected with the plurality of write-assist bit lines when at least one of the memory cells electrically connected to the plurality of second word lines is configured to be written.

According to some embodiments of the present disclosure, an integrated circuit comprises: a plurality of memory cells, arranged in an array having a plurality of rows and a plurality of columns; at least one first word line and a plurality of second word lines, extending along a first direction, wherein the at least one first word line is electrically connected to at least one row of the plurality of memory cells, and the plurality of second word lines are electrically connected to other rows of the plurality of memory cells; a plurality of bit lines, extending along a second direction, wherein each column of the plurality of memory cells are electrically connected between two of the plurality of bit lines; a plurality of write-assist bit lines, extending along the second direction, wherein two of the plurality of bit lines are located between a column of the plurality of memory cells and two of the plurality of write-assist bit lines; and a plurality of write-assist transistors, respectively connected between one of the plurality of bit lines and one of the plurality of write-assist bit lines, wherein gates of the plurality of write-assist transistors are electrically connected to the plurality of write-assist bit lines, sources or drains of the plurality of write-assist transistors are electrically connected to the plurality of bit lines, the other ones of the sources and the drains of the plurality of write-assist transistors are coupled to a logic low level or a logic high level.

According to some embodiments of the present disclosure, an operating method of an integrated circuit is provided. The integrated circuit comprises a plurality of memory cells, a plurality of word lines, a plurality of bit lines and a plurality of write-assist bit lines, each of the plurality of memory cells is electrically connected to one of the plurality of word lines and at least two of the plurality of bit lines, each of the plurality of bit lines is connected to one of the plurality of write-assist bit lines. The operating method of the integrated circuit comprises: grouping the plurality of memory cells into a first group and a second group; determining if at least one of the memory cells in the second group is configured to be written; electrically connecting the plurality of bit lines to the plurality of write-assist bit lines if at least one of the memory cells in the second group is configured to be written; and electrically disconnecting the plurality of bit lines from the plurality of write-assist bit lines if none of the memory cells in the second group is configured to be written.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a plurality of memory cells, arranged in an array having a plurality of rows and a plurality of columns;
   at least one first word line and a plurality of second word lines, extending along a first direction, wherein the at least one first word line is electrically connected to at least one row of the plurality of memory cells, and the plurality of second word lines are electrically connected to other rows of the plurality of memory cells;
   a plurality of bit lines, extending along a second direction, wherein each column of the plurality of memory cells are electrically connected between two of the plurality of bit lines; and
   a plurality of write-assist bit lines, extending along the second direction, wherein two of the plurality of bit lines are located between a column of the plurality of memory cells and two of the plurality of write-assist bit lines, wherein the plurality of bit lines and the plurality of write-assist bit lines are configured to be electrically disconnected with each other when at least one of the memory cells electrically connected with the at least one first word line is configured to be written, and wherein the plurality of bit lines are electrically connected with the plurality of write-assist bit lines when at least one of the memory cells electrically connected to the plurality of second word lines is configured to be written.

2. The integrated circuit according to claim 1, wherein the plurality of write-assist bit lines are configured to charge or discharge the plurality of bit lines when at least one of the memory cells electrically connected to the plurality of second word lines is configured to be written.

3. The integrated circuit according to claim 1, wherein electrical connections between the plurality of bit lines and the plurality of write-assist bit lines are controlled by a plurality of write-assist transistors.

4. The integrated circuit according to claim 3, wherein gates of the plurality of write-assist transistors are respectively connected to one of a plurality of write-assist word lines.

5. The integrated circuit according to claim 4, wherein the plurality of write-assist word lines extend along the first direction, and at least one of the plurality of second word lines is located between two of the plurality of second word lines.

6. The integrated circuit according to claim 4, wherein the plurality of write-assist word lines are electrically connected to a write-assist driver.

7. The integrated circuit according to claim 6, wherein the write-assist driver is configured to determine when to enable the plurality of write-assist word lines according to inputs including a write enablement signal and a write-assist enable signal, the write enablement signal is at a logic low level when at least one of the plurality of memory cells is configured to be written and at a logic high level when the plurality of memory cells are not configured to be written, the write-assist enable signal is at a high logic level when at least one of the memory cells electrically connected to the plurality of second word lines is selected and at a logic low level when the memory cells electrically connected to the plurality of second word lines are not selected, the write-assist driver is configured to enable the plurality of write-assist word lines when the write enablement signal is at the logic low level and the write-assist enable signal is at the logic high level.

8. The integrated circuit according to claim 7, wherein the write-assist driver is configured not to enable the plurality of write-assist word lines when the write enablement signal is at the logic high level, and when the write enablement signal and the write-assist enable signal are both at the logic low level.

9. The integrated circuit according to claim 6, wherein the bit lines and the write-assist bit lines electrically connected to each column of the plurality of memory cells are controlled by a bit line driver, the bit line driver is configured to provide a logic low voltage or a logic high voltage to the corresponding write-assist bit lines when at least one of the memory cells electrically connected to the plurality of second word lines is configured to be written, and the bit line driver is configured to electrically float the corresponding write-assist bit lines when none of the memory cells electrically connected to the plurality of second word lines is configured to be written.

10. The integrated circuit according to claim 9, wherein the bit line driver is electrically connected to a low voltage generation circuit, the low voltage generation circuit is configured to provide a ground voltage or a negative voltage.

11. The integrated circuit according to claim 1, wherein the plurality of memory cells comprise a plurality of static random access memory cells.

12. The integrated circuit according to claim 11, wherein the plurality of static random access memory cells are respectively a single port static random access memory cell or a dual port static random access memory cell.

13. An integrated circuit, comprising:
   a plurality of memory cells, arranged in an array having a plurality of rows and a plurality of columns;
   at least one first word line and a plurality of second word lines, extending along a first direction, wherein the at least one first word line is electrically connected to at least one row of the plurality of memory cells, and the plurality of second word lines are electrically connected to other rows of the plurality of memory cells;
   a plurality of bit lines, extending along a second direction, wherein each column of the plurality of memory cells are electrically connected between two of the plurality of bit lines;
   a plurality of write-assist bit lines, extending along the second direction, wherein two of the plurality of bit lines are located between a column of the plurality of memory cells and two of the plurality of write-assist bit lines; and
   a plurality of write-assist transistors, respectively connected between one of the plurality of bit lines and one of the plurality of write-assist bit lines, wherein gates of the plurality of write-assist transistors are electrically connected to the plurality of write-assist bit lines, sources or drains of the plurality of write-assist transistors are electrically connected to the plurality of bit lines, the other ones of the sources and the drains of the plurality of write-assist transistors are coupled to a logic low level.

14. The integrated circuit according to claim 13, wherein the plurality of write-assist bit lines are configured to turn on the plurality of write-assist transistors when one of the memory cells electrically connected to the plurality of second word lines is configured to be written, and configured not to turn on the plurality of write-assist transistors when none of the memory cells electrically connected to the plurality of second word lines is configured to be written.

15. An operating method of an integrated circuit, wherein the integrated circuit comprise a plurality of memory cells, a plurality of word lines, a plurality of bit lines and a plurality of write-assist bit lines, each of the plurality of memory cells is electrically connected to one of the plurality of word lines and at least two of the plurality of bit lines, each of the plurality of bit lines is connected to one of the plurality of write-assist bit lines, and the operating method of the integrated circuit comprises:
   grouping the plurality of memory cells into a first group and a second group;
   determining if at least one of the memory cells in the second group is configured to be written;
   electrically connecting the plurality of bit lines to the plurality of write-assist bit lines if at least one of the memory cells in the second group is configured to be written; and electrically disconnecting the plurality of bit lines from the plurality of write-assist bit lines if none of the memory cells in the second group is configured to be written.

16. The operating method of the integrated circuit according to claim 15, wherein grouping the plurality of memory cells is implemented by determining a critical row address, at least one row of the plurality of memory cells having a row address lower than the critical row address are designated as the first group, and rows of the plurality of memory cells having a row address higher than the critical row address are designated as the second group.

17. The operating method of the integrated circuit according to claim 15, wherein a write-assist driver is configured to determine whether at least one of the memory cells in the second group is configured to be written.

18. The operating method of the integrated circuit according to claim 17, wherein the write-assist driver is configured to determine whether at least one of the memory cells in the second group is configured to be written by inputs including a write enablement signal and a write-assist enable signal, the write enablement signal is at a logic low level when at least one of the plurality of memory cells is configured to be written and at a logic high level when the plurality of memory cells are not configured to be written, the write-assist enable signal is at a high logic level when at least one of the memory cells in the second group is selected and at a logic low level when the memory cells in the second group are not selected, the write-assist driver is configured to determine at least one of the plurality of memory cells in the second group is configured to be written when the write enablement signal is at the logic low level and the write-assist enable signal is at the logic high level.

19. The operating method of the integrated circuit according to claim 18, wherein the write-assist driver is configured determine none of the memory cells in the second group is configured to be written when the write enablement signal is at the logic high level, and when the write enablement signal and the write-assist enable signal are both at the logic low level.

20. The operating method of the integrated circuit according to claim 15, wherein an electrical connection between the plurality of bit lines and the plurality of write-assist bit lines are implemented by a plurality of write-assist transistors.

* * * * *